United States Patent [19]

Carson

[11] Patent Number: 5,196,980
[45] Date of Patent: Mar. 23, 1993

[54] LOW IMPEDANCE, HIGH VOLTAGE PROTECTION CIRCUIT

[75] Inventor: Daniel B. Carson, Bothell, Wash.

[73] Assignee: John Fluke Mfg. Co., Inc., Everett, Wash.

[21] Appl. No.: 646,865

[22] Filed: Jan. 28, 1991

[51] Int. Cl.⁵ .................. H02H 7/09; G01R 1/36
[52] U.S. Cl. ................................ 361/18; 361/56
[58] Field of Search ............... 361/18, 58, 91, 56, 361/111

[56] References Cited

U.S. PATENT DOCUMENTS

| 3,886,379 | 5/1975 | Bickley et al. | 361/58 |
|---|---|---|---|
| 4,020,395 | 4/1977 | Erickson et al. | 361/111 |
| 4,405,964 | 9/1983 | Woods et al. | 361/18 |
| 4,533,970 | 8/1985 | Brown | 361/58 |
| 4,658,320 | 4/1987 | Hongel | 361/13 |

Primary Examiner—A. D. Pellinen
Assistant Examiner—Ronald W. Leja
Attorney, Agent, or Firm—John P. Dellett; Richard A. Koske

[57] ABSTRACT

A low impedance overvoltage protection circuit includes a first MOSFET having a drain connected to an input signal and a source connected to a drain of a second MOSFET, the source of the second MOSFET being coupled to the output. The gates of the first and second MOSFETs are connected to voltage supplies which float relative to the input signal values so as to maintain the gates of the respective MOSFETs biased to a conducting state. The maximum and minimum values to which the floating voltage supplies will float are defined by clamping diodes and clamp voltage sources. When the input signal value exceeds a desired positive maximum value, the first MOSFET is no longer biased to an on state whereby the MOSFET turns off, shunting the input signal through a high impedance for limiting input current and removing the input signal from the output. Negative going peak values are removed in a like manner by the second MOSFET. Bipolar transistors are coupled to each MOSFET to allow quick turn off in the event of rapid rise time transient input values.

21 Claims, 2 Drawing Sheets

LOW IMPEDANCE, HIGH VOLTAGE PROTECTION CIRCUIT

BACKGROUND OF THE INVENTION

The present invention relates to a low input impedance voltage protection system for electronic measurement devices and particularly to such a system that will switch to a high impedance state when the input voltage exceeds a desired range.

A problem in voltmeter design is protecting circuitry from input-overvoltage while keeping the sensitivity and noise suppression at acceptable levels to allow precise voltage measurements of DC and AC signals. Due to power surges, noise or misapplication of measurement probes, a voltmeter may be measuring values in the millivolt range and moments later be presented with a 1000 volt signal at its input terminals. Circuitry capable of measuring small voltage levels typically is not able to survive the sudden appearance of large voltage inputs without damage to the circuit components. A known method of providing input voltage protection employs a large resistance in series with the input signal to limit peak current and clamping diodes between the input signal and positive and negative voltage rails to limit peak input voltage. While that type of circuit protects the measurement device from excessive voltage and current swings, it creates sensitivity and noise problems. Large input resistors facilitate noise pick-up and generation and also create errors measuring high frequency AC signals. For example, a one megohm resistor when coupled to a stray capacitance of about ten picofarads will limit precise measurements to about one kilohertz. Also a one megohm input resistor will produce 130 nanovolts/root hertz thermal noise. Large DC errors are created when bias current from meter amplifier inputs or leakage current from over-voltage protection diodes flow through large input resistors. It would be desirable to provide a low impedance input for signals within a specified voltage range with switching to a higher impedance state when large voltage levels appear at the input.

SUMMARY OF THE INVENTION

According to one aspect of the invention, a low impedance overvoltage protection circuit comprises a pair of metal-oxide-semiconductor field effect transistors (MOSFETs) biased by a pair of floating voltage sources so as to be conductive when circuit input voltages are within a desired range. The MOSFET pair is in series so the input signal flows from the drain terminal to the source terminal of a first MOSFET and then from the drain terminal to the source terminal of a second MOSFET to the output terminal. One MOSFET element is configured so as to enter a nonconductive state when the input voltage exceeds a peak positive value while the other MOSFET enters a nonconductive state when the input value exceeds a peak negative value. The floating voltage source maintains the bias on the MOSFETs as long as the input voltage is within a predetermined voltage range.

Peak voltage levels are set by connecting a positive and negative rail voltage through clamp diodes to the respective floating voltage source. The voltage sources float only to the level set by the clamp diodes and as the input signal increases, bringing the floating voltage sources to that set level, the MOSFET gate-to-source voltage begins to decrease whereby a further increase in input voltage causes the MOSFET to cease conducting for switching in high impedance. The protection circuit also includes fast switching bipolar transistors that prevent MOSFET destruction for fast rise time input signals by discharging capacitive charge, since MOSFET capacitance may otherwise prevent the circuit from isolating large input voltages from the rest of the circuit components in a timely manner.

According to another aspect of the invention, a series of MOSFET pairs and impedances may be combined to provide greater maximum voltage handling capability. Any number of MOSFET pairs may be combined in series, each pair increasing the voltage handling capability by a known amount.

It is an object of the present invention to provide an improved low impedance overvoltage protection circuit.

It is another object of the present invention to provide an improved overvoltage protection circuit which is relatively immune to noise.

It is still another object of the present invention to provide an improved overvoltage protection circuit which will not produce large DC error voltages.

It is yet another object of the present invention to provide an improved overvoltage protection circuit which can provide a low impedance path from input to output for signals in a range of interest and which will provide a high impedance state for large signals, thereby preventing damage to sensitive circuitry.

It is another object of the present invention to provide an overvoltage protection circuit which may be modified to standoff any desired range of maximum input voltages.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

DETAILED DESCRIPTION

Figure 1:
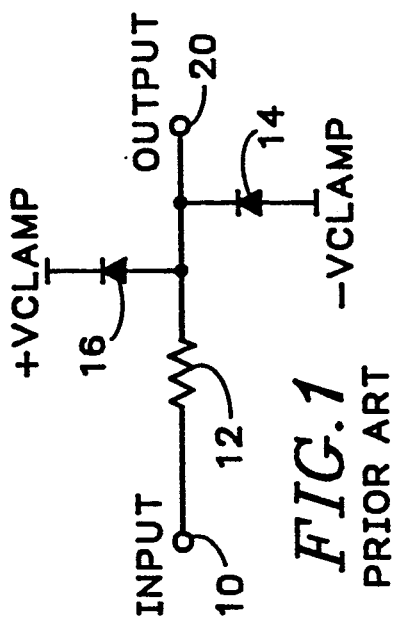
FIG. 1 is a schematic diagram of an overvoltage protection circuit in accordance with the prior art.

Referring now to FIG. 1, a schematic diagram of an overvoltage protection circuit in accordance with the prior art, an input signal at input terminal 10 is supplied through input resistor 12 to the cathode of diode 14 and the anode of diode 16. The anode of diode 14 receives a voltage −VCLAMP while the cathode of diode 16 is supplied with a voltage +VCLAMP. Circuit output 20 is drawn from the end of resistor 12 opposite the input. Resistor 12 serves to limit peak current while the two diodes limit peak voltage.

In normal operation an input signal passes from input 10 to output 20 reducing the current by an amount proportional to the value of resistor 12. The current from resistor 12 does not flow through diode 14 and diode 16 when the voltage on output line 20 is between +VCLAMP and −VCLAMP. (e.g. −VCLAMP<=Vout<=+VCLAMP). If the voltage magnitude on output line 20 minus the voltage drop across diode 16 is greater than +VCLAMP, diode 16 becomes forward biased and begins to conduct in the forward biased region and the current through diode 16 increases greatly for small increases in voltage. This limits (clamps) the positive voltage on output line 20 to +VCLAMP plus the voltage drop across the diode. In a similar manner, if the output voltage on line 20 minus the voltage drop across diode 14 is less than −VCLAMP, diode 14 becomes forward biased allowing current to pass from −VCLAMP to output line 20. As the current therethrough increases, the voltage across diode 14 remains constant, clamping the output voltage value. The values of +VCLAMP and −VCLAMP are chosen in accordance with the requirements of the measurement circuit coupled to output line 20 so that the maximum voltage magnitude on output line 20 will not damage the components receiving the output signal.

One disadvantage to the foregoing method is noise; the higher the value of input resistor 12, the greater the magnitude of noise that may be produced. Large input resistances can also invite noise pickup from nearby sources such as transformers, displays or digital circuits. Another drawback of this overvoltage protection circuit is DC error; bias current from an amplifier receiving output 20 or leakage current from diodes 14 and 16 will flow through the large input resistance, generating the error voltage. For example, an input amplifier with a bias current specification of 175 picoamperes will drop 175 microvolts across a one megohm resistor. If desired measurement resolution is one microvolt, this error voltage is unacceptable. Another potential problem with the input protection circuitry of FIG. 1 arises when measuring AC signals since a large input resistance, coupled with stray capacitance, causes measurement errors at high frequencies. For example, if a stray capacitance of ten picofarads exists, a one megohm input resistance limits precise measurements to about one kilohertz.

Figure 2:
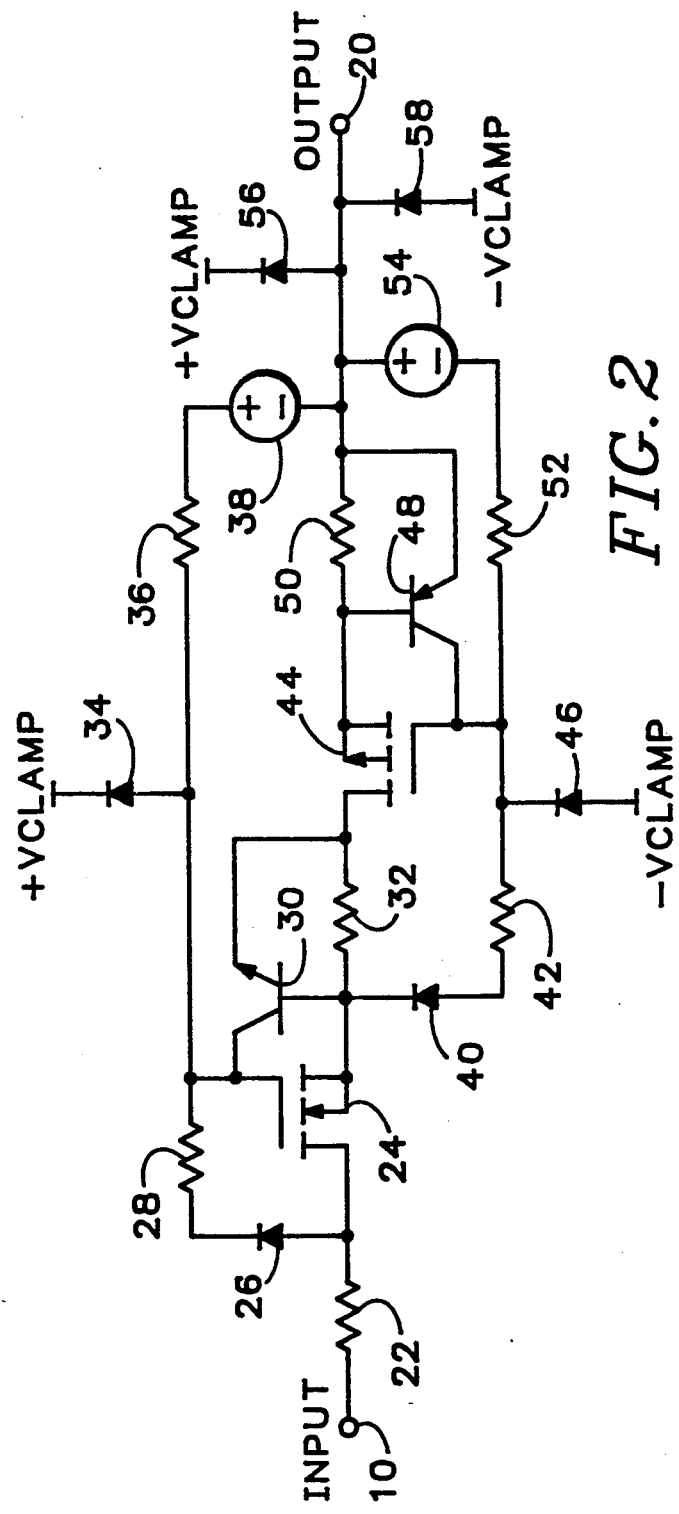
FIG. 2 is a schematic diagram of an overvoltage protection circuit according to the present invention.

FIG. 2 is a schematic diagram of an overvoltage protection circuit according to the present invention. The input signal at terminal 10 is coupled via resistor 22 to the drain of n-channel enhancement mode MOSFET 24 and to the anode of diode 26. The cathode of the diode 26 is connected via resistor 28 to the gate of MOSFET 24 as well as to the collector of bipolar npn transistor 30, the base of which is connected to the source of the MOSFET 24 and by way of resistor 32 to the emitter of transistor 30. The gate of MOSFET 24 is further tied to the anode of clamp diode 34, and is coupled through resistor 36 to the positive node of voltage supply 38. The negative terminal of voltage supply 38 connects to the output signal line 20, the voltage supply 38 providing a potential of VS1. The cathode of diode 34 is provided a voltage of value +VCLAMP.

The junction at the base of transistor 30 and the source of MOSFET 24 is coupled to the cathode of diode 40 while the anode thereof connects through resistor 42 to the gate of p-channel enhancement mode MOSFET 44. The drain of MOSFET 44 has a common connection with the emitter of transistor 30. Clamp diode 46 has its cathode connected to the gate of MOSFET 44, its anode being supplied with the voltage value −VCLAMP. The collector of pnp bipolar transistor 48 is connected in common with the gate of MOSFET 44, while the base of the transistor connects to the source of MOSFET 44. The emitter of the transistor is joined to the output signal line and, through resistor 50, to its own base. Resistor 52 is interposed between the gate of MOSFET 44 and the negative node of voltage supply 54, the positive terminal of which is tied to the output signal line. Supply 54 provides a value of VS2. The anode of clamp diode 56 and the cathode of clamp diode 58 are respectively coupled to the output signal line, while the cathode of diode 56 is connected to +VCLAMP voltage and the anode of diode 58 to −VCLAMP. The signal output is taken from line 20.

In operation, MOSFET 24 and MOSFET 44 are biased by the voltage supplies 38 and 54 (VS1 and VS2 are suitably 5.1 volts) so as to be normally in a conductive state. Therefore, an input signal within a predetermined voltage range will pass through resistor 22, MOSFET 24, resistor 32, MOSFET 44 and resistor 50, thereby appearing on output line 20. Output line 20 is coupled to measurement circuitry or any electrical system as may be sensitive to large voltage levels. Using TO-92 500 V MOSFETs with drain to source impedance in the "ON" state of approximately 35 ohms for n-channel devices and 70 ohms for p-channel devices, the total input impedance from input line 10 to output line 20 is equal to R22+35 ohms+R32+70 ohms+R50. Typically R22 is 200 ohms, R32 and R50 are 10 ohms, resulting in an input impedance of 325 ohms. Thus, the usual noise and frequency problems associated with large input impedances are greatly minimized. As the input signal begins to rise positively, the voltage on line 20 also increases, the voltage source 38 floating with the rise in output voltage. The gate of MOSFET 24 retains a relatively positive value with respect to the rise in output voltage (and the source of MOSFET 24), maintaining MOSFET 24 in a conductive state. However, the increasing voltage is limited by the voltage supply +VCLAMP. As the voltage continues to increase, diode 34 becomes forward biased and starts conducting, preventing voltage supply 38 from floating any farther above the output signal. For a typical +VCLAMP of 9.1 volts, once the input signal value is equal to VCLAMP−VS1 (or 9.1 volts−5.1 volts=4 volts), clamp diode 34 begins to conduct, clamping the voltage level at the gate of MOSFET 24 to +VCLAMP. As the input signal continues to increase, the gate of MOSFET 24 is held at +VCLAMP and the gate to source voltage difference starts to fall below five volts. As the gate voltage is reduced, the drain to source impedance starts to increase, and MOSFET 24 eventually turns off when the gate to source voltage approaches zero. Without sufficient potential difference between the source and gate, MOSFET 24 is not biased to conduct, and the low impedance path for the input signal to the output node is shut off for in effect removing the signal from the output and preventing damage to circuits connected to the output node.

Similarly, if a large negative input signal is applied to input line 10, MOSFET 44 will turn off. As the input (and hence the output) becomes increasingly negative, supply 54 floats lower with input, maintaining a bias on the gate of MOSFET 44 of VS2 volts below the output signal. However, clamp diode 46 places a lower bound on the floating voltage supply 54 so that once the signal on output 20 is equal to −VCLAMP−VS2, diode 46 conducts, clamping the gate at −VCLAMP. As the input signal increases in the negative direction, the gate voltage on MOSFET 44 approaches zero relative to the source voltage, and eventually the gate to source voltage is low enough to cause MOSFET 44 to turn off.

Diodes 56 and 58 function in a manner similar to the clamp diodes described in connection with FIG. 1. During the short duration of time while the circuit is in the process of turning off and thereafter, diodes 56 and 58 limit the output voltage to the range of +/−VCLAMP, to prevent damage to instrumentation connected to line 20.

Bipolar transistors 30 and 48 provide protection with respect to input signals with fast rise times. MOSFETs 24 and 48 have a significant amount of gate to source capacitance, on the order of 60 picofarads, and it can take a considerable amount of time to discharge that capacitance and to allow the MOSFET to turn off. The time period is sufficient to permit a large input voltage to destroy the MOSFETs or the circuitry following output 20. Therefore, bipolar transistors 30 and 48 are employed to quickly discharge the capacitive voltage that keeps the MOSFETs biased. With a fast rising positive input signal, MOSFET 24, which will eventually turn off, remains biased on. However, sufficient current flows through resistor 32 for generating a voltage drop (suitably 0.7 volts) sufficient to cause transistor 30 to turn on. Once in the conducting state, transistor 30 quickly discharges the gate capacitance on MOSFET 24 thereby permitting the MOSFET to turn off. Similarly, for a negative going peak the current through resistor 50 will be such that transistor 48 will conduct, discharging the gate capacitance of MOSFET 44 and allowing the MOSFET to turn off quickly. The bipolar transistors, in addition to providing current limiting by discharging gate to source capacitance, also provide gate/source protection for the MOSFETs since the bipolar transistors have a lower breakdown voltage than the MOSFETs.

When the input voltage is above +VCLAMP (plus diode drops to account for diodes 26 and 34) MOSFET 24 is off and the input signal flows through diode 26, resistor 28 and diode 34. Resistor 28 is relatively large and limits input current. The gate of MOSFET 24 is held at +VCLAMP. Once the input signal drops below +VCLAMP, diodes 34 and 26 cease to conduct, and the floating voltage source 38 begins to recharge the gate of MOSFET 24. Since resistors 28 and 36 are relatively large (suitably 660K ohm and 1.2 Megohm respectively), the gate recharges slowly. After the gate has recharged sufficiently, the MOSFET will once again begin to conduct for permitting the input signal to again pass to the output.

MOSFET 44 behaves in a similar manner when the input signal is below −VCLAMP, with the signal flowing through diode 40, resistor 42 and diode 46. Gate recharge by floating voltage source 54 through resistor 52 occurs when the input signal rises above −VCLAMP.

The slow gate recharge and therefore the slow return of the MOSFET to a conductive state is advantageous in that the application of large magnitude high frequency sine wave or the like will cause the circuit to shut off quickly, but will not allow the circuit to turn back on as fast as it shut off. Therefore, the circuit remains in a nonconductive state during the application of the high frequency wave rather than shutting off and on rapidly with the input signal variation. An advantage of the fast discharge and slow charge characteristic of the circuit is that high frequency input signals will keep the circuit in an off state, restricting the amount of current drawn. Restricting current prevents tripping input signal supplies that have exceeded their source current limits. The circuit draws approximately the same current for both low and high frequency input signals.

The use of the floating voltage supplies 38 and 54 allows increased measurement accuracy by stabilizing the biasing voltage across each MOSFET. The "ON" resistance of MOSFETs may vary with fluctuations in the gate voltage but by floating the biasing voltage of the MOSFET, signal fluctuations will not affect circuit impedance. The MOSFETs, in addition to providing low impedance, are purely resistive when in the "ON" state, supplying a linear resistance that enables high accuracy DC signal measurement. The specific embodiment of FIG. 2 is capable of handling +/−500 volt input signals.

Figure 3A:
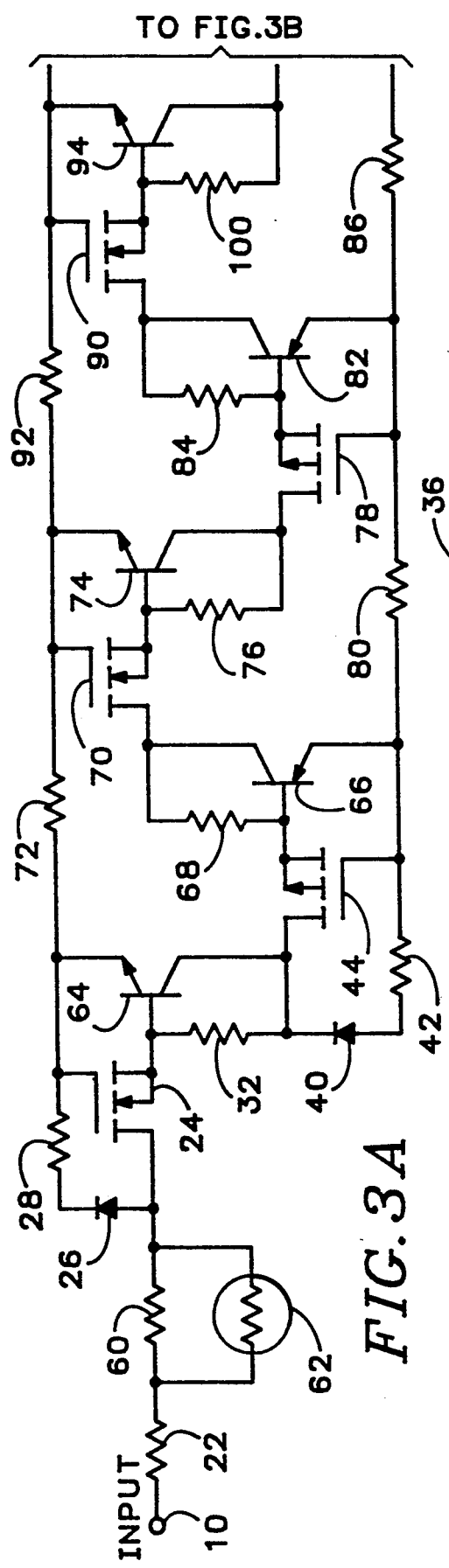
FIGS. 3A and 3B are schematic diagrams of a second embodiment of an overvoltage protection circuit according to the present invention employing additional MOSFET elements.
Figure 3B:
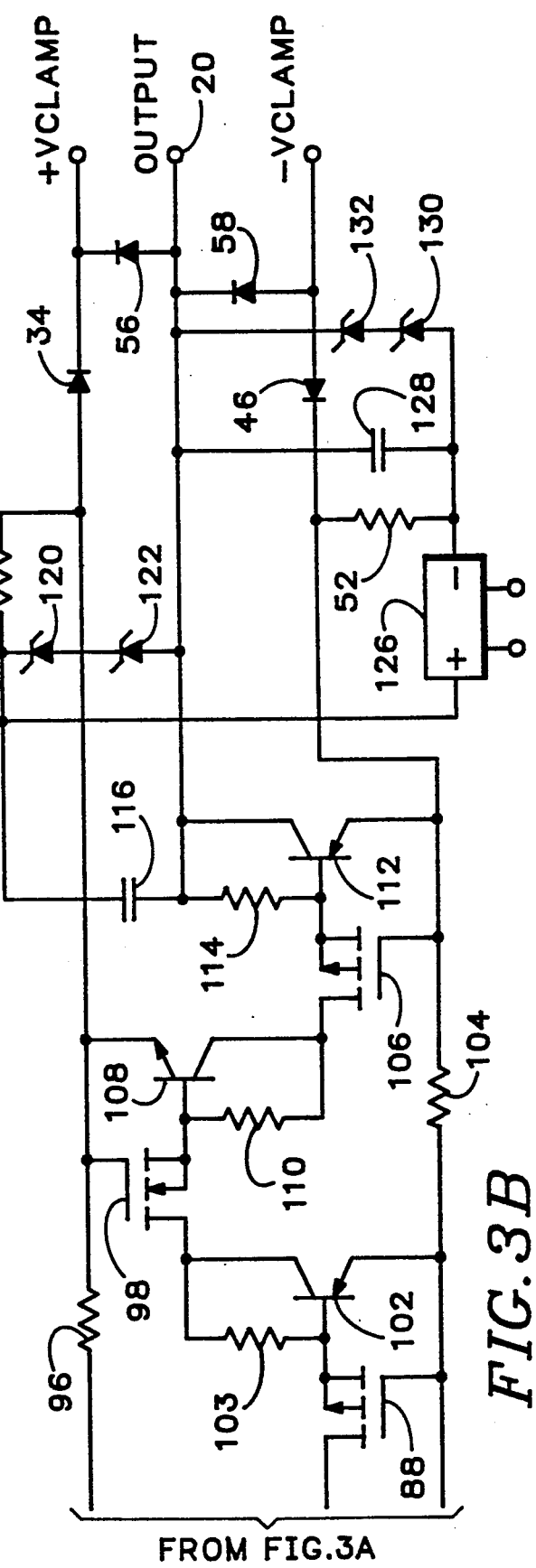

Referring now to FIGS. 3A and 3B, described hereinafter as FIG. 3, a schematic diagram of an alternative embodiment of the present invention, additional MOSFET stages are added to increase maximum input voltage handling capability. Input terminal 10 is coupled through resistor 22 in series with the parallel combination of resistor 60 and thermistor 62 to the anode of diode 26 and to the drain of n-channel enhancement mode MOSFET 24. The cathode of diode 26 connects to resistor 28 which has its opposite terminal attached to the gate of MOSFET 24. The gate of MOSFET 24 also is coupled to the emitter of bipolar npn transistor 64, the base of which transistor is connected to the source of MOSFET 24. Resistor 32 connects the MOSFET source terminal to the collector of transistor 64. The collector-resistor junction is also in common with the drain of p-channel enhancement mode MOSFET 44 as well as the cathode of diode 40. The anode of the diode is coupled via resistor 42 to the gate of MOSFET 44 and to the emitter of pnp bipolar transistor 66. The source of MOSFET 44 and the base of transistor 66 are joined, and through resistor 68 are connected to the collector of transistor 66 and the drain of n-channel enhancement mode MOSFET 70. The gate terminal of MOSFET 70 is coupled via resistor 72 to the gate of MOSFET 24. MOSFET 70 has its source terminal connected to the base of npn bipolar transistor 74 and through resistor 76 to the collector of transistor 74 as well as the drain terminal of p-channel enhancement mode MOSFET 78.

Resistor 80 is interposed between the gate of MOSFET 44 and the gate of MOSFET 78 while the source terminal of MOSFET 78 is connected to the base of pnp bipolar transistor 82 and to a terminal of resistor 84. The emitter of transistor 82 connects to the gate of MOSFET 78 and, through resistor 86, to the gate of p-channel enhancement mode MOSFET 88. The remaining terminal of resistor 84 is joined to the collector of transistor 82 as well as to the drain of n-channel enhancement mode MOSFET 90. The gate of MOSFET 90 is coupled via resistor 92 to the gate of MOSFET 70 while also being connected to the emitter of npn bipolar transistor 94 and, through resistor 96, to the gate of n-channel enhancement mode MOSFET 98.

The source terminal of MOSFET 90 is connected to the base of transistor 94 as well as to a terminal of resistor 100, the opposite terminal of which is connected in common to the drain of MOSFET 88 and the collector of transistor 94. The source of MOSFET 88 is joined to the base of pnp bipolar transistor 102 and via resistor 103 to the collector of transistor 102 and the drain of MOSFET 98. The emitter of transistor 102 and the gate of MOSFET 88 are coupled by means of resistor 104 to the gate terminal of n-channel enhancement mode MOSFET 106, the drain terminal of which is common with the collector of npn bipolar transistor 108 together with one terminal of resistor 110. The opposite lead of resistor 110 and the base of transistor 108 are connected to the source of MOSFET 98, while the gate of MOSFET 98 connects to the emitter of transistor 108.

The gate of MOSFET 98 is further connected to the anode of clamp diode 34, the cathode of which is supplied with a voltage +VCLAMP. The source of MOSFET 106 receives the base lead of pnp bipolar transistor 112 as well as one terminal of resistor 114 while the opposite terminal of the resistor, the collector of transistor 112 and a terminal of capacitor 116 connect to output terminal 20. The opposite terminal of capacitor 116 is coupled via resistor 36 to the anode of diode 34. The last-mentioned terminal of capacitor 116 also connects to the cathode of band gap reference 120 in series with band gap reference 122, the anode of the latter connecting to output 20.

Output terminal 20 is connected to the anode of clamp diode 56 as well as to the cathode of clamp diode 58, clamp diode 56 having its cathode tied to +VCLAMP while the anode of diode 58 receives −VCLAMP. The emitter of transistor 112 and the gate of MOSFET 106 connect to the cathode of clamp diode 46, the anode thereof receiving the −VCLAMP voltage reference. Resistor 52 couples the negative output of photovoltaic stack 126 in common with a terminal of capacitor 128 and the anode of band gap reference 130 to the cathode of diode 46, band gap reference 130 in series with band gap reference 132 being interposed between the negative output of stack 126 and output terminal 20. Capacitor 128 is shunted across the last-mentioned series circuit. The positive terminal of photovoltaic stack 126 supplies the node connecting the cathode of band gap reference 120, a lead of resistor 36 and a terminal of capacitor 116.

The internal components of the photovoltaic stack comprise a light emitting diode or diodes which, when provided with supply voltage, produce light output conveyed through a light pipe to photodiodes for generating a voltage output. The photovoltaic stack 126, capacitors 116 and 128 and band gap references 120, 122, 130 and 132 correspond to the floating voltage sources 38 and 54 of FIG. 2.

The embodiment of FIG. 3 operates in a manner similar to the embodiment of FIG. 2 but is capable of withstanding input voltages four times that of the embodiment of FIG. 2. Each MOSFET and associated components have a maximum voltage which they can withstand which is 500 volts in the present example. The combination of MOSFETs 24, 70, 90 and 98 in conjunction with resistors 28, 72, 92 and 96 allow positive peak voltages of approximately +2000 volts, while the MOSFETs 44, 78, 88 and 106 in conjunction with resistors 42, 80, 86 and 104 allow negative peak voltages of −2000 volts.

As the input signal increases during operation, the floating source (suitably five volts) floats on top of the input voltage until diode 34 starts to conduct, the input voltage required to turn on diode 34 being +VCLAMP plus the voltage drop across diode 34 minus the floating voltage source value. As the input voltage is increased further, the five volts on the gates of the MOSFETs starts to decrease and the "ON" resistance of the MOSFETs starts to increase. As the voltage at the gates is reduced sufficiently, the impedance of the MOSFETs increases, essentially turning the MOSFETs off. As the voltage further increases, the gate to source voltage on MOSFET 98 is substantially zero and the MOSFET conducts no current. Since MOSFETs 90, 70 and 24 are coupled to MOSFET 98 in series, no current flows through them either. The MOSFETs operate as source followers with zero current in which case the voltage on each gate is now determined by the voltage division of the resistor string comprising elements 28, 72, 92 and 96. When an input signal appears which is overvoltage, the resistors 28, 72, 92 and 96 (or resistors 42, 80, 86 and 104 for negative-going voltage) form a voltage divider which evenly divides the input voltage across four MOSFETs, providing each MOSFET with one-fourth the total input voltage. Since there is very little current flowing through the MOSFET string, the source voltage on each MOSFET will follow its respective gate voltage. This will cause the gate to source voltage to remain at a small value, below the threshold level necessary to turn the MOSFET on. Resistors 28, 72, 92, 96, as well as resistors 42, 80, 86 and 104, limit input current during overvoltage conditions.

Since the "ON" resistance of the MOSFETs varies approximately one percent per degree, the circuit could have a frequency response varying with temperature. Therefore, thermistor 62 is coupled in parallel with resistor 60 and this circuit is connected in series with the signal input/output path. As the ambient temperature increases, the resistance of thermistor 62 decreases, reducing the cumulative resistance of the parallel resistor pair while at the same time the drain to source impedance of each MOSFET increases. Thus, the combination of resistor 22, resistor 60 and thermistor 62 tend to cancel out changes in the MOSFET resistance. Similarly, the photovoltaic stack may have a poor temperature coefficient, so the addition of band gap references 120, 122, 130 and 132 provides a stable floating voltage source for varying temperatures. Capacitors 116 and 128 provide a well behaved frequency response.

The embodiment of FIG. 3 operates according to the same principles as that of FIG. 2. Note, however, that transistors 64, 74, 94, 108 and 66, 82, 102, 112 are reversed from their counterparts 30 and 48 of FIG. 2, i.e., the emitter and collectors of the transistors are reversed in FIG. 3 from the connection as would be expected based on FIG. 2. The transistors in FIG. 3 are used in their reverse active region, the collectors being used as emitters, and the emitters as collectors, permitting use of the base/emitter junction as a zener diode. Bipolar transistors when operated backwards as in FIG. 3 work in the same manner as when operated in the forward direction; however, the gain is lower and the base-emitter breakdown (actually the base-collector breakdown in FIG. 3) is lower. The transistors are chosen so that their breakdown voltage is lower than the gate-source breakdown of the MOSFETs, providing protection to the MOSFET devices. In a particular embodiment, the breakdown voltage of the transistors was six volts, while the MOSFETs had a twenty volt breakdown. Further, employing the transistors in this manner provides lower leakage and lower capacitance than if zener diodes were used.

Since in a preferred embodiment, each MOSFET was capable of 500 volt standoff, the series combination thereof allows 2000 volts to be continuously held off.

The number of MOSFET pairs may be increased or reduced to provide any desired range of protection.

In a circuit employing high voltage n-channel and p-channel depletion mode MOSFETs, simplifications can be made. Depletion mode MOSFETs are normally on and voltage application to the gate causes these MOSFETs to enter a nonconductive state. The circuitry for providing bias voltage would then not be required to maintain the MOSFETs in a default conductive state. As a further alternative, the bipolar transistors in the overvoltage protection circuitry could be replaced by zener diodes placed between the gate and source of each MOSFET. However, zener diodes have higher leakage and higher capacitance than the bipolar transistors, as stated above.

While plural embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A low impedance overvoltage protection circuit comprising:
   a low impedance stage for normally coupling an input signal to an output terminal, said low impedance stage including a control terminal;
   high impedance means disposed in shunt relation to the input of said low impedance stage; and
   clamping means coupled to said control terminal and responsive to the input for altering the conductive state of said low impedance stage when said input signal exceeds a predetermined voltage range such that said input signal is shunted from said low impedance stage via said high impedance means.

2. The circuit according to claim 1 further comprising a plurality of additional low impedance stages, said stages being arranged serially, the outputs of ones of said stages supplying the inputs for subsequent stages, said plurality of stages providing greater voltage handling capability than would a single stage.

3. The circuit according to claim 1 wherein said low impedance stage comprises a MOSFET, the drain terminal of said MOSFET receiving said input signal, and the source terminal of said MOSFET being coupled to said output terminal.

4. The circuit according to claim 3 including biasing means for said low impedance stage wherein bias voltage is provided from said output terminal.

5. The circuit according to claim 1 wherein said low impedance stage comprises a first and a second MOSFET, the drain terminal of said first MOSFET receiving said input signal, the source terminal of said first MOSFET being coupled to the drain terminal of said second MOSFET, and the source terminal of said second MOSFET being coupled to said output terminal.

6. A low impedance high voltage protection circuit comprising:
   an input terminal;
   an output terminal;
   a MOSFET having its drain coupled to said input terminal and its source coupled to provide a signal for said output terminal;
   resistor means coupled between the drain and gate of said MOSFET;
   bias means coupled to said resistor means and to said output terminal for biasing said MOSFET to normally conductive state and for maintaining a stable bias voltage on said MOSFET over a range of voltages at said input terminal; and
   diode clamping means coupled to the gate of said MOSFET for altering the bias on said MOSFET in response to an input signal exceeding said range of voltages at said input terminal to alter the conductive state of said MOSFET.

7. The circuit according to claim 6 further comprising means for discharging the MOSFET gate to source capacitance in response to a rapidly rising input signal for enabling said MOSFET to change rapidly to a nonconductive state.

8. The circuit according to claim 6 wherein said bias means comprises a voltage source floating relative to the output terminal of said circuit.

9. A low impedance high voltage protection circuit comprising:
   first conductance means having a low impedance and receiving an input signal for producing an output signal, said first conductance means being capable of switching to a nonconductive state;
   second conductance means having a high impedance and disposed in shunt relation to said first conductance means; and
   clamping means for switching said first conductance means to a nonconductive state to apply the input signal to said second conductance means, said clamping means being responsive to the voltage level of the input signal exceeding a predetermined clamping level.

10. The circuit according to claim 9 further comprising temperature compensation means for maintaining constant circuit impedance over a range of ambient temperatures.

11. The circuit according to claim 9 wherein said first conductance means comprises a MOSFET.

12. The circuit according to claim 11 wherein said means for switching said MOSFET to a nonconductive state further includes means for rapidly discharging gate-source capacitance of said MOSFET in response to a fast rise-time input signal.

13. The circuit according to claim 11 wherein said means for switching said MOSFET further comprises bias means for biasing said MOSFET to a conductive state and for maintaining a stable bias voltage on said MOSFET over a predetermined range of input voltages.

14. The circuit according to claim 11 wherein said clamping means for switching said MOSFET is provided with bias voltage supply means for providing a floating bias voltage to a gate terminal of said MOSFET relative to the input signal voltage level.

15. A low impedance overvoltage protection circuit comprising:
   a low impedance stage for normally coupling an input signal to an output terminal, said low impedance stage comprising a first and a second MOSFET, the drain terminal of said first MOSFET receiving said input signal, the source terminal of said first MOSFET being coupled to the drain terminal of said second MOSFET, and the source terminal of said second MOSFET being coupled to said output terminal;
   high impedance means disposed in shunt relation to said low impedance stage;

means for switching said low impedance means to a high impedance state, said means for switching including means responsive to said input signal and providing a voltage for biasing said first MOSFET to an off state for excessive positive signal values and providing a voltage for biasing said second MOSFET to an off state for excessive negative signal values; and means for coupling said input signal to said high impedance means.

16. A low impedance high voltage protection circuit comprising:

an input terminal;

an output terminal;

a MOSFET having its drain coupled to said input terminal and its source coupled to said output terminal;

high impedance means including a normally non-conducting diode disposed in shunt relation to said input terminal; and clamping means coupled to the gate of said MOSFET for altering the conductive state of said MOSFET in response to an input signal as seen at said output terminal exceeding a predetermined range of voltages at said input terminal such that said input signal is shunted via said high impedance means.

17. The circuit according to claim 16 wherein said high impedance means is disposed in shunt relation to said input terminal via said clamping means.

18. The circuit according to claim 16 wherein said clamping means is returned to a source of reference potential.

19. The circuit according to claim 16 including biasing means for normally causing said MOSFET to conduct.

20. The circuit according to claim 12 wherein said means for rapidly discharging comprises bipolar transistor means.

21. A low impedance overvoltage protection circuit comprising:

a low impedance stage for normally coupling an input signal to an output terminal, said low impedance stage comprising a first and a second MOSFET, the drain terminal of said first MOSFET receiving said input signal, the source terminal of said first MOSFET being coupled to the drain terminal of said second MOSFET, and the source terminal of said second MOSFET being coupled to said output terminal, high impedance means disposed in shunt relation to said low impedance stage;

means for switching said low impedance means including means for switching said first MOSFET to an off state for excessive positive signal values and means for switching said second MOSFET to an off state for excessive negative signal values; and means for coupling said input signal to said high impedance means.

* * * * *